(12) United States Patent
He et al.

(10) Patent No.: US 10,629,776 B2
(45) Date of Patent: Apr. 21, 2020

(54) LIGHT EMITTING DEVICE AND PRODUCTION METHOD THEREOF

(71) Applicant: XIAMEN SAN'AN OPTOELECTRONICS CO., LTD., Xiamen (CN)

(72) Inventors: Anhe He, Xiamen (CN); Su-Hui Lin, Xiamen (CN); Kang-Wei Peng, Xiamen (CN); Ling-Yuan Hong, Xiamen (CN); Yu-Chieh Huang, Xiamen (CN); Zhanggen Xia, Xiamen (CN)

(73) Assignee: Xiamen San' an Optoelectronics Co., Ltd., Xiamen, Fujian (CN)

( * ) Notice: Subject to any disclaimer, the term of this patent is extended or adjusted under 35 U.S.C. 154(b) by 0 days.

(21) Appl. No.: 16/285,438

(22) Filed: Feb. 26, 2019

(65) Prior Publication Data

US 2019/0189851 A1 Jun. 20, 2019

Related U.S. Application Data

(63) Continuation-in-part of application No. PCT/CN2017/087718, filed on Jun. 9, 2017.

(30) Foreign Application Priority Data

Aug. 30, 2016 (CN) .......................... 2016 1 0758712

(51) Int. Cl.
*H01L 33/36* (2010.01)
*H01L 33/62* (2010.01)
(Continued)

(52) U.S. Cl.
CPC ............ *H01L 33/36* (2013.01); *H01L 33/007* (2013.01); *H01L 33/32* (2013.01); *H01L 33/38* (2013.01);
(Continued)

(58) Field of Classification Search
CPC ......... H01L 33/02; H01L 33/20; H01L 33/24; H01L 33/36; H01L 33/38; H01L 33/44
See application file for complete search history.

(56) References Cited

U.S. PATENT DOCUMENTS 9,595,646 B2 * 3/2017 Happoya ................. H01L 33/54
2004/0232429 A1 * 11/2004 Miki ....................... H01L 33/42
257/79

(Continued)

FOREIGN PATENT DOCUMENTS

| CN | 103367590 A | 10/2013 |
|---|---|---|
| CN | 106252470 A | 12/2016 |
| JP | H0499327 A | 3/1992 |

OTHER PUBLICATIONS

Search Report issued to PCT Application No. PCT/CN2017/087718 by the International Searching Authority dated Aug. 28, 2017.

(Continued)

*Primary Examiner* — Eduardo A Rodela
(74) *Attorney, Agent, or Firm* — Rosenberg, Klein & Lee

(57) ABSTRACT

A light emitting device includes a substrate, a light emitting unit disposed on the substrate, a metallic electrode unit, a metallic adhesion layer disposed on the first and second electrodes of the electrode unit, and a protective layer disposed on the adhesion layer. The first electrode is disposed on a portion of a first-type semiconductor layer of the light emitting unit. The second electrode is disposed on a second-type semiconductor layer of the light emitting unit disposed on a separated portion of the first-type semiconductor layer. The first and second electrodes are partially exposed by the protective layer and the adhesion layer that is partially exposed by the protective layer. A production method for the light emitting device is also disclosed.

13 Claims, 9 Drawing Sheets

(51) Int. Cl.
  *H01L 33/40* (2010.01)
  *H01L 33/44* (2010.01)
  *H01L 33/00* (2010.01)
  *H01L 33/32* (2010.01)
  *H01L 33/38* (2010.01)

(52) U.S. Cl.
  CPC .............. *H01L 33/40* (2013.01); *H01L 33/44* (2013.01); *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 2007/0048885 A1* | 3/2007 | Jeon ...................... | H01L 33/507 438/22 |
| 2007/0246735 A1* | 10/2007 | Yahata .................... | H01L 33/40 257/103 |
| 2011/0012146 A1* | 1/2011 | Hitsuda ................. | H01L 33/405 257/94 |
| 2011/0297987 A1* | 12/2011 | Koizumi ................. | H01L 33/44 257/98 |
| 2011/0316126 A1* | 12/2011 | Emura .................... | H01L 33/44 257/632 |
| 2012/0033409 A1* | 2/2012 | Jeong ..................... | H01L 33/20 362/97.1 |
| 2012/0248405 A1 | 10/2012 | Tu et al. | |
| 2013/0256732 A1* | 10/2013 | Miki ..................... | H01L 33/405 257/98 |
| 2015/0187995 A1* | 7/2015 | Yoneda .................. | H01L 33/38 257/98 |
| 2016/0149086 A1* | 5/2016 | Sim ........................ | H01L 33/46 257/98 |

OTHER PUBLICATIONS

Search Report appended to an Office Action, which was issued to Chinese counterpart application No. 201610758712.9 by CNIPA dated Feb. 9, 2018, with an English translation thereof.

* cited by examiner

LIGHT EMITTING DEVICE AND PRODUCTION METHOD THEREOF

CROSS-REFERENCE TO RELATED APPLICATION

This application is a bypass continuation-in-part application of International Application No. PCT/CN2017/087718 filed on Jun. 9, 2017, which claims priority of Chinese Patent Application No. 201610758712.9, filed on Aug. 30, 2016. The entire content of each of the international and Chinese patent applications is incorporated herein by reference.

FIELD

The disclosure relates to a semiconductor device, and more particularly to a gallium nitride-based light emitting device.

BACKGROUND

Regarding conventional LED (light emitting diode) chips, normally, silicon dioxide ($SiO_2$) is used to form a surface insulating layer, and a chromium/platinum/gold (Cr/Pt/Au) multilayer serves as an electrode structure (as shown in FIG. 1). Alternatively, an aluminum (Al) reflective layer is further inserted to form a Cr/Al/Pt/Au multilayer which serves as a reflection electrode structure. In the aforesaid electrode structures, Au is used as a metal material for wire bonding during packaging, but the adhesion between Au and the semiconductor protection material (e.g. $SiO_2$) is poor. Namely, during the production of a LED chip, the parts of the $SiO_2$ insulating layer in contact with the Au layer of the electrode structure might easily separate from the electrode structure, or might be detached from the electrode structure by a pulling or pushing force applied. Accordingly, the $SiO_2$ insulating layer cannot provide sufficient protection for the electrode structure, such that the LED chip might undergo abnormality arising from aging of packaging, e.g. migration of the Cr layer, oxidation of the Al layer, lumen depreciation, etc. Particularly, in the absence of a satisfactory protection layer, a display chip might easily undergo aerosol contamination that induces undesired permeation of organic substances and water vapor into the electrode structure, which in turn leads to electromigration of metal ions and even serious aging and other abnormality.

In order to enhance the structural tightness, an electrode structure disclosed in CN 103238223 A is produced by depositing a metal material having stronger adhesion to $SiO_2$, such as nickel (Ni), Ti (titanium), or titanium-tungsten (TiW), on a surface layer of an electrode. It is disclosed in CN 103238223 A that the Ni layer is subjected to etching to expose the Au layer for the same to serve as a surface electrode. For example, a dry etching process, such as inductively coupled plasma (ICP) etching, may be used. However, the aforesaid process might easily damage the Au layer and result in dark spots, such that a gold wire for wire bonding might not be securely bonded. Furthermore, as shown in FIG. 2, the $SiO_2$ protective layer disposed over the Ni layer (i.e. the uppermost layer) of the five-layered electrode structure might be easily detached from the electrode structure by a pulling or pushing force applied during wire bonding for packaging (please note that the cloud-shaped substance in FIG. 2 represents a detached part of the $SiO_2$ protective layer), thereby inducing malfunction of the chip during use or aging.

SUMMARY

Therefore, an object of the disclosure is to provide a light emitting device and a production method thereof that can alleviate at least one of the drawbacks of the prior art.

The light emitting device includes a substrate, a light emitting unit, a metallic electrode unit, a metallic adhesion layer, and a protective layer. The light emitting unit is disposed on the substrate, and includes a first-type semiconductor layer, a light emitting layer, and a second-type semiconductor layer which are sequentially arranged from bottom to top. The first-type semiconductor layer is partially overlaid by the light emitting layer and the second-type semiconductor layer. The metallic electrode unit includes a first metallic multilayer electrode and a second metallic multilayer electrode. The first metallic multilayer electrode is disposed on a first placement portion of the first-type semiconductor layer which is not overlaid by the light emitting layer and the second-type semiconductor layer. The light emitting layer and the second-type semiconductor layer are disposed on a second placement portion of the first-type semiconductor layer to overlay the first-type semiconductor layer. The first and second placement portions of the first-type semiconductor layer are separated by a spacer portion of the first-type semiconductor layer. The second metallic multilayer electrode is disposed on the second-type semiconductor layer. The metallic adhesion layer is disposed on the first and second metallic multilayer electrodes. The protective layer is disposed on the metallic adhesion layer. Each of the first and second metallic multilayer electrodes is partially exposed by the metallic adhesion layer and the protective layer. The metallic adhesion layer is partially exposed by the protective layer on each of the first and second metallic multilayer electrodes.

The production method includes: providing a growth substrate; epitaxially growing a light emitting unit on the growth substrate, the light emitting unit including a first-type semiconductor layer, a light emitting layer, and a second-type semiconductor layer which are sequentially arranged from bottom to top; etching a part of the second-type semiconductor layer and a part of the light emitting layer so that a first placement portion of the first-type semiconductor layer is exposed, the light emitting layer and the second-type semiconductor layer overlaying an unexposed second placement portion of the first-type semiconductor layer, the first and second placement portions of the first-type semiconductor layer being separated by a spacer portion of the first-type semiconductor layer; forming a first metallic multilayer electrode on the first placement portion of the first-type semiconductor layer; forming a second metallic multilayer electrode on the second-type semiconductor layer; forming a metallic adhesion layer on the first and second metallic multilayer electrodes, each of the first and second metallic multilayer electrodes being partially exposed by the metallic adhesion layer; and depositing a protective layer on the metallic adhesion layer, each of the first and second metallic multilayer electrodes being partially exposed by the protective layer, the metallic adhesion layer being partially exposed by the protective layer on each of the first and second metallic multilayer electrodes.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
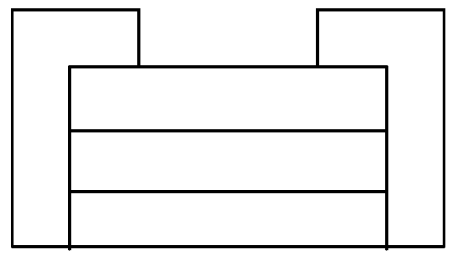
FIG. 1 is a schematic sectional view illustrating an electrode and a protective layer of a conventional light emitting diode.
Figure 2:
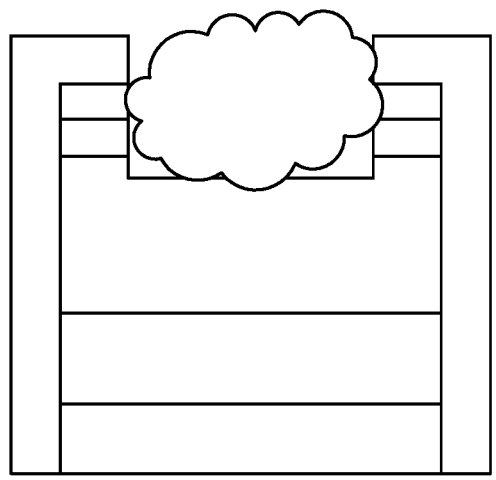
FIG. 2 is a schematic sectional view illustrating an electrode and a protective layer of another conventional light emitting diode.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
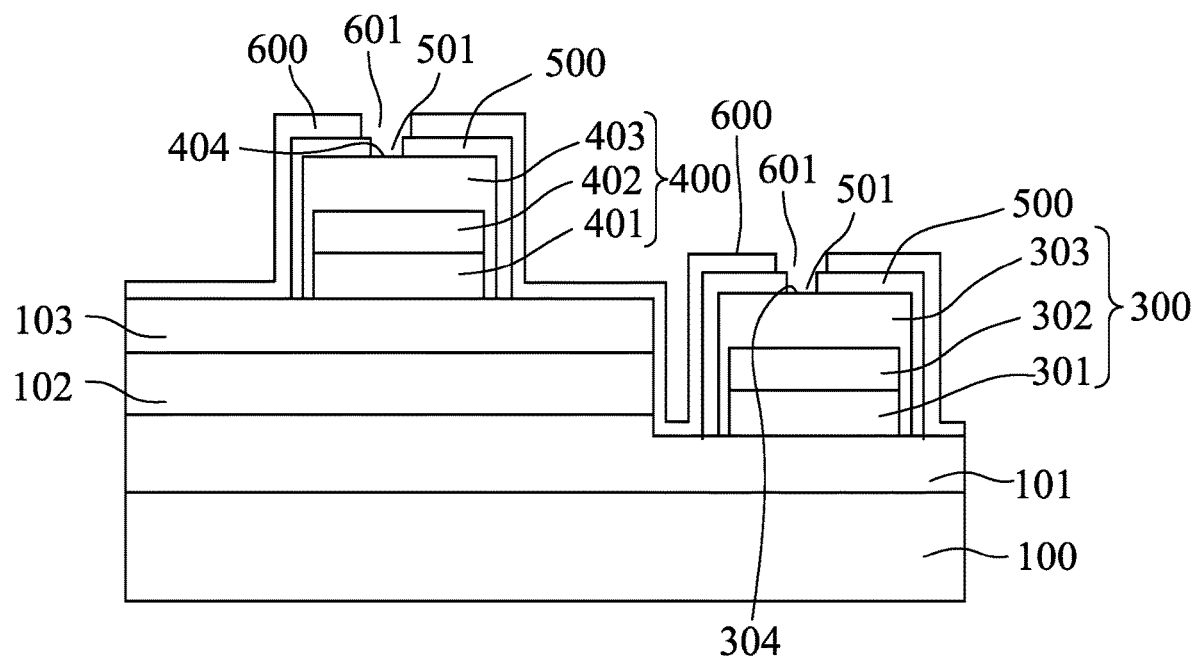
FIG. 3 is a schematic sectional view of a first embodiment of a light emitting device according to the present disclosure.

Referring to FIG. 3, a first embodiment of a light emitting device according to the present disclosure may be a gallium nitride (GaN)-based light emitting diode, and includes a substrate 100, a light emitting unit, a metallic electrode unit, a metallic adhesion layer 500, and a protective layer 600.

The substrate 100 may be a growth substrate used to form the light emitting unit. Exemplary growth substrates include, but are not limited to, a sapphire substrate, a silicon carbide (SiC)-based substrate, a GaN-based substrate, a silicon-based substrate, etc. In this embodiment, the substrate 100 is a sapphire substrate.

The light emitting unit is disposed on the substrate 100, and includes a first-type semiconductor layer 101, a light emitting layer 102, and a second-type semiconductor layer 103 which are sequentially arranged from bottom to top. The first-type semiconductor layer 101 is partially overlaid by the light emitting layer 102 and the second-type semiconductor layer 103.

The metallic electrode unit includes a first metallic multilayer electrode 300 and a second metallic multilayer electrode 400. The first metallic multilayer electrode 300 is disposed on a first placement portion of the first-type semiconductor layer 101 which is not overlaid by the light emitting layer 102 and the second-type semiconductor layer 103. The light emitting layer 102 and the second-type semiconductor layer 103 are disposed on a second placement portion of the first-type semiconductor layer 101 to overlay the first-type semiconductor layer 101. The first and second placement portions of the first-type semiconductor layer 101 are separated by a spacer portion of the first-type semiconductor layer 101. The second metallic multilayer electrode 400 is disposed on the second-type semiconductor layer 103.

The first-type semiconductor layer 101 extends from a top surface of the substrate 100 to terminate at an upper surface that has the first and second placement portions and the spacer portion. In this embodiment, the upper surface of the first-type semiconductor layer 101 is in a stepped form. The first and second placement portions are respectively lowered and elevated, and are separated by the spacer portion that is vertical. It should be noted that the upper surface of the first-type semiconductor layer 101 may be in other form in other embodiments, and hence the spacer portion may be a recess or a protrusion as long as the first and second placement portions can be separated.

The light emitting layer 102 extends from the second placement portion of the upper surface of the first-type semiconductor layer 101 to terminate at an upward surface. The second-type semiconductor layer 103 extends from the upward surface of the light emitting layer 102 to terminate at a loading surface on which the second metallic multilayer electrode 400 is disposed.

The metallic adhesion layer 500 is disposed on the first and second metallic multilayer electrodes 300, 400. The protective layer 600 is disposed on the metallic adhesion layer 500. In this embodiment, the protective layer 600 is also disposed on parts of the loading surface of the second-type semiconductor layer 103 that the second metallic multilayer electrode 400 is not disposed on, a lateral surface of the second-type semiconductor layer 103, a side surface of the light emitting layer 102, the spacer portion of the first-type semiconductor layer 101, and parts of the first placement portion of the first-type semiconductor layer 101 that the first metallic multilayer electrode 300 is not disposed on.

For wire bonding, each of the first and second metallic multilayer electrodes 300, 400 is partially exposed by the metallic adhesion layer 500 and the protective layer 600, and the metallic adhesion layer 500 is partially exposed by the protective layer 600 on each of the first and second metallic multilayer electrodes 300, 400.

In this embodiment, the metallic adhesion layer 500 is disposed over the first and second metallic multilayer electrodes 300, 400, and has two first through-holes 501 that partially expose a top electrode surface 304 of the first metallic multilayer electrode 300 and a top electrode surface 404 of the second metallic multilayer electrode 400, respectively. The protective layer 600 is disposed over the metallic adhesion layer 500, and has two second through-holes 601 that are in spatial communication with the first through-holes 501, respectively. The second through-holes 601 partially expose the top electrode surface 304 of the first metallic multilayer electrode 300 and the top electrode surface 404 of the second metallic multilayer electrode 400, respectively. The second through-holes 601 are larger in size than the first through-holes 501, respectively, so that the second through-holes 601 partially expose the metallic adhesion layer 500.

An exposed part of the top electrode surface 304 of the first metallic multilayer electrode 300, which is exposed by a respective one of the first through-holes 501 and a respective one of the second through-holes 601, and an exposed part of the top electrode surface 404 of the second metallic multilayer electrode 400, which is exposed by a respective one of the first through-holes 501 and a respective one of the second through-holes 601, are each adapted to be connected to a bonding wire. Adhesion between the metallic adhesion layer 500 and the first metallic multilayer electrode 300 is stronger than that between the metallic adhesion layer 500 and the bonding wire. Adhesion between the metallic adhesion layer 500 and the second metallic multilayer electrode 400 is stronger than that between the metallic adhesion layer 500 and the bonding wire.

The metallic adhesion layer 500 may be made from a material selected from the group consisting of titanium (Ti), titanium nitride (TiN), chromium (Cr), nickel (Ni), and combinations thereof. In this embodiment, the metallic adhesion layer 500 is made from Ti.

The first metallic multilayer electrode 300 includes a first bottom layer 301 that is disposed on the first placement portion of the first-type semiconductor layer 101, a first top layer 303 that is disposed over the first bottom layer 301 and has the top electrode surface 304 of the first metallic multilayer electrode 300, and a first intermediate layer 302 that is interposed between the first bottom layer 301 and the first top layer 303. Each of the first bottom layer 301, the first intermediate layer 302, and the first top layer 303 is made from a metal material.

The second metallic multilayer electrode 400 includes a second bottom layer 401 that is disposed on the loading surface of the second-type semiconductor layer 103, a second top layer 403 that is disposed over the second bottom layer 401 and has the top electrode surface 404 of the second metallic multilayer electrode 400, and a second intermediate layer 402 that is interposed between the second bottom layer 401 and the second top layer 403. Each of the second bottom layer 401, the second intermediate layer 402, and the second top layer 403 is made from a metal material.

The first top layer 303 of the first metallic multilayer electrode 300 and the second top layer 403 of the second metallic multilayer electrode 400 each is made from platinum (Pt) which is highly resistant to etching, thereby preventing formation of dark spots that lead to abnormality such as weak adhesion to bonding wires.

The first intermediate layer 302 and the first top layer 303 of the first metallic multilayer electrode 300, as well as the second intermediate layer 402 and the second top layer 403 of the second metallic multilayer electrode 400, may contain a reflective metal material which is selected from aluminum (Al), silver (Ag), an Al—Ag alloy, and combinations thereof. In this embodiment, each of the first intermediate layer 302 and the second intermediate layer 402 contains Al.

The first bottom layer 301 of the first metallic multilayer electrode 300 and the second bottom layer 401 of the second metallic multilayer electrode 400 each may be from a material selected from the group consisting of Cr, Ti, Ni, and combinations thereof. In this embodiment, each of the first bottom layer 301 and the second bottom layer 401 is made from Cr.

In this embodiment, since the first top layer 303 covers the first intermediate layer 302 and the first bottom layer 301, and since the second top layer 403 covers the second intermediate layer 402 and the second bottom layer 401, the Al metal material can be protected from oxidation, and the Cr metal material can be prevented from migration.

One of the first-type semiconductor layer 101 and the second-type semiconductor layer 103 is an n-type semiconductor layer, and the other one of the first-type semiconductor layer 101 and the second-type semiconductor layer 103 is a p-type semiconductor layer. In this embodiment, the first-type semiconductor layer 101 is an n-type semiconductor layer, and the second-type semiconductor layer 103 is a p-type semiconductor layer.

One of the first and second metallic multilayer electrodes 300, 400 is an n-electrode, and the other one of the first and second metallic multilayer electrodes 300, 400 is a p-electrode. In this embodiment, the first metallic multilayer electrode 300 is an n-electrode, and the second metallic multilayer electrode 400 is a p-electrode.

Each of the first-type semiconductor layer, the light emitting layer 102, and the second-type semiconductor layer 103 may be made from a GaN-based semiconductor material.

The protective layer 600 may be made from a material selected from the group consisting of silicon oxide ($SiO_2$), silicon nitride ($Si_3N_4$), aluminum oxide ($Al_2O_3$), titanium oxide ($TiO_2$), and combinations thereof. In this embodiment, the protective layer 600 is made from $SiO_2$.

The advantages of the light emitting device according to the present disclosure are described as follows.

First, since each of the first and second metallic multilayer electrodes 300, 400 is partially exposed by the metallic adhesion layer 500 and the protective layer 600, and since the metallic adhesion layer 500 is partially exposed by the protective layer 600 on each of the first and second metallic multilayer electrodes 300, 400 (for example, the second through-holes 601 of the protective layer 600 are made larger in size than the first through-holes 501 of the metallic adhesion layer 500, respectively, for the second through-holes 601 to achieve such partial exposure of the metallic adhesion layer 500), the protective layer 600 can be prevented from being undesirably detached from the light emitting device by a pulling or pushing force applied, for instance, during wire bonding or chip production (i.e. lateral protection can be achieved).

Secondly, the metallic adhesion layer 500 made from Ti has satisfactory adhesion to the first top layer 303 and the second top layer 403 each made from Pt, as well as to the protective layer 600 made from $SiO_2$, and is thermally stable, such that the attachability of the protective layer 600 to the first and second metallic multilayer electrodes 300, 400, over which the protective layer 600 is disposed, can be enhanced. Therefore, the protective layer 600 can be prevented from being undesirably detached from the light emitting device by a pulling or pushing force applied, for instance, during wire bonding or chip production (i.e. lateral protection can be achieved), and can protect the reflective metal material in the first and second metallic multilayer electrodes 300, 400 from exposure to air and oxidation caused thereby. The tolerance of the light emitting device of the present disclosure to the high temperature and moisture is satisfactory.

Thirdly, the adhesion between the metallic adhesion layer 500 (made from Ti) and the first metallic multilayer electrode 300 is stronger than that between the metallic adhesion layer 500 and the bonding wire (e.g. a gold wire), and the adhesion between the metallic adhesion layer 500 and the second metallic multilayer electrode 400 is stronger than that between the metallic adhesion layer 500 and the bonding wire. Thus, when a pulling or pushing force is exerted on the bonding wire during the wire bonding process, the bonding wire, when undesirably brought to contact with the metallic adhesion layer 500 in the first through-holes 501 thereof, may break, such that parts of the protective layer 600 close to the second through-holes 601 can be prevented from being damaged.

Fourthly, the first intermediate layer 302 and the first bottom layer 301, as well as the second intermediate layer 402 and the second bottom layer 401, are further covered by the metallic adhesion layer 500 and the protective layer 600 in addition to the respective one of the first and second top layers 303, 403. Therefore, the Al metal material (or an Ag material if used) in the first intermediate layer 302 and the second intermediate layer 402 can be protected from oxidation, the Cr metal material in the first bottom layer 301 and the second bottom layer 401 can be prevented from migration, and water vapor and aerosol can be prevented from permeating into the first and second intermediate layers 302, 402 and the first and second bottom layers 301, 401.

Figure 4:
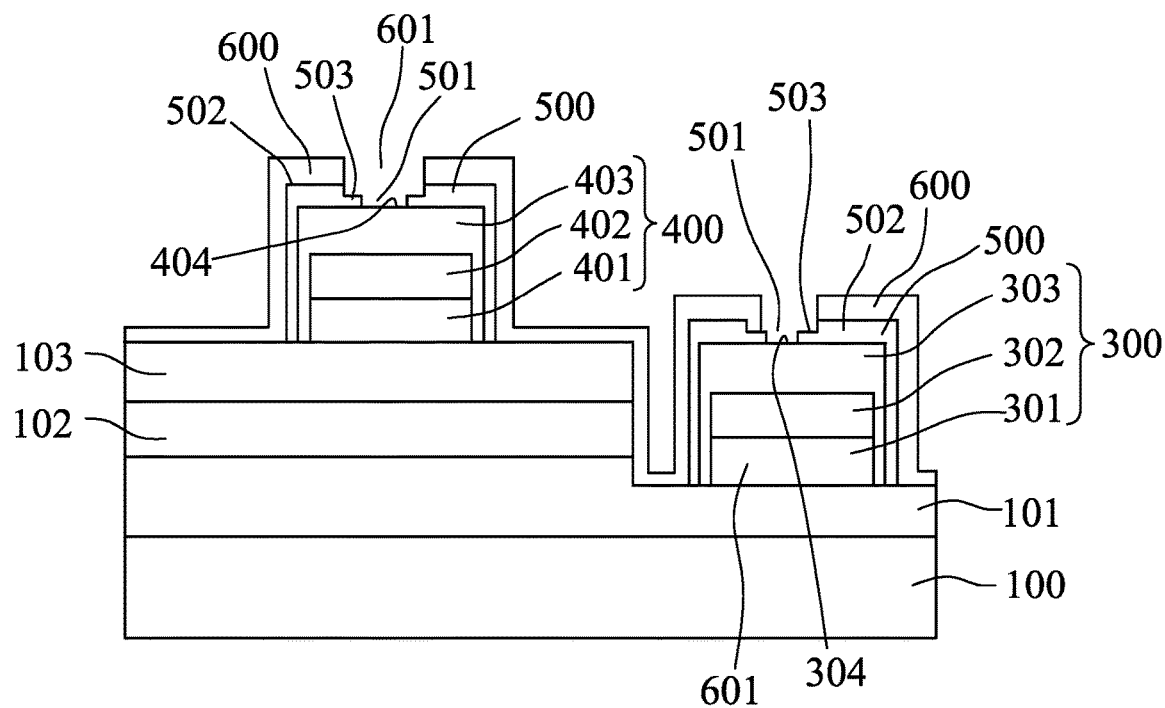
FIG. 4 is a schematic sectional view of a second embodiment of the light emitting device according to the present disclosure.
Figure 5:
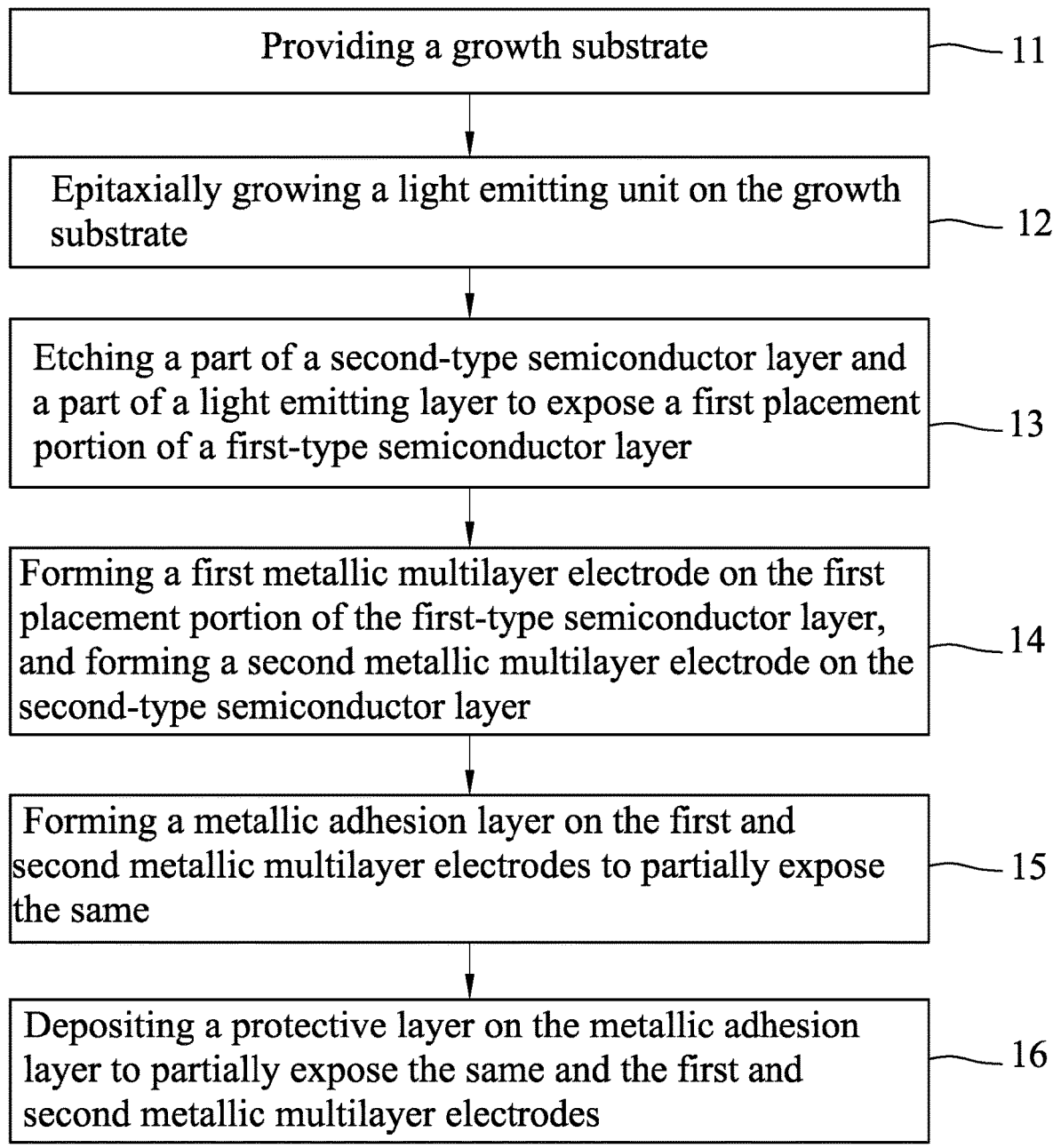
FIG. 5 is a flow chart of steps of a method for producing the first embodiment of the light emitting device according to the present disclosure.
Figure 12:
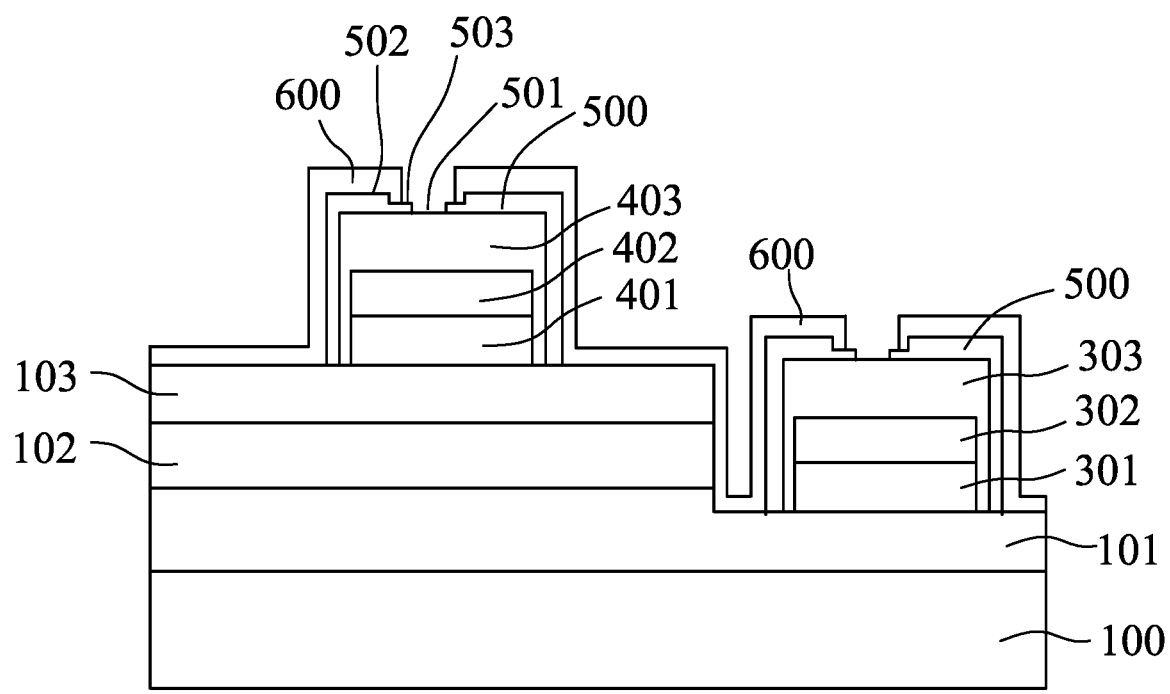
FIG. 12 is a schematic sectional view of a third embodiment of the light emitting device according to the present disclosure.

Referring to FIGS. 4 and 12, second and third embodiments of the light emitting device according to the present disclosure are similar to the first embodiment, except that the metallic adhesion layer 500 has stepped portions 502 which are respectively disposed over the top electrode surfaces 304, 404 of the first and second metallic multi layer electrodes 300, 400. Each of the stepped portions 502 has a lowered hole defining wall 503 that defines a corresponding one of the first through-holes 501, and an elevated covering that extends radially from the lowered hole defining wall 503. The protective layer 600 is disposed over the elevated coverings of the stepped portions 502 of the metallic adhesion layer 500 on both the top electrode surfaces 304, 404 of the first and second metallic multilayer electrodes 300, 400.

In the second embodiment, the protective layer 600 is disposed on a part of the lowered hole defining wall 503 of the stepped portion 502 of the metallic adhesion layer 500 on the top electrode surface 304 of the first metallic multilayer electrode 300. In the third embodiment, the protective layer 600 is disposed on a part of each of the lowered hole defining walls 503 of the stepped portions 502 of the metallic adhesion layer 500 on the top electrode surfaces 304, 404 of the first and second metallic multilayer electrodes 300, 400.

Since the lowered hole defining walls 503 of the stepped portions 502 of the metallic adhesion layer 500 can more easily break the bonding wire, in particular that with a larger diameter, the protection for the protective layer 600 can be further assured.

Referring to FIGS. 5 to 11, a method for producing the first embodiment of the light emitting device is described as follows.

Figure 6:
FIGS. 6 to 11 are schematic sectional views respectively illustrating the steps of the method for producing the first embodiment of the light emitting device.

In step 11, the substrate 100, which is a growth substrate, is provided (see FIG. 6).

Figure 7:
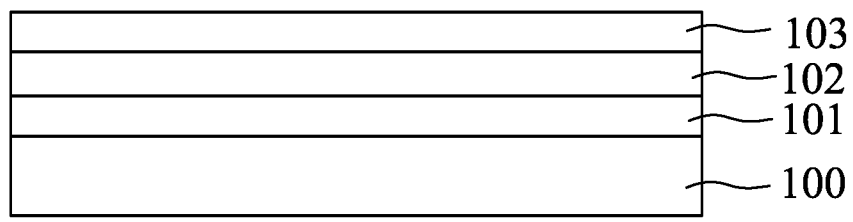

In step 12, as shown in FIG. 7, the light emitting unit is epitaxially grown on the substrate 100 by virtue of metal-organic chemical vapor deposition (MOCVD).

Figure 8:
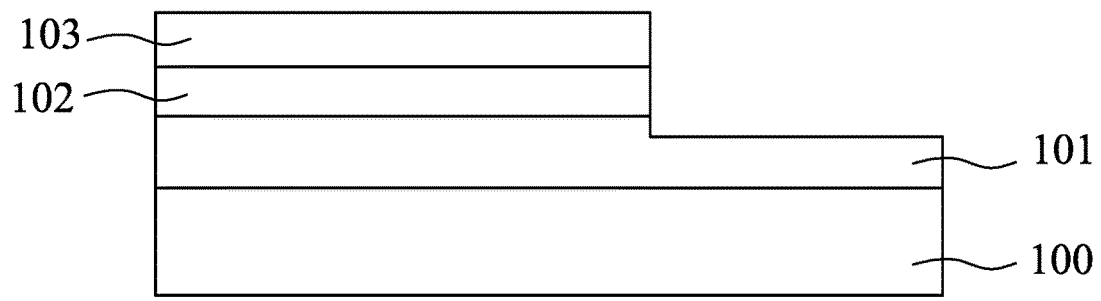

In step 13, apart of the second-type semiconductor layer 103 and a part of the light emitting layer 102 are etched through a dry etching process (e.g. inductively coupled plasma (ICP) etching), so that the first placement portion of the first-type semiconductor layer 101 is exposed (see FIG. 8).

Figure 9:
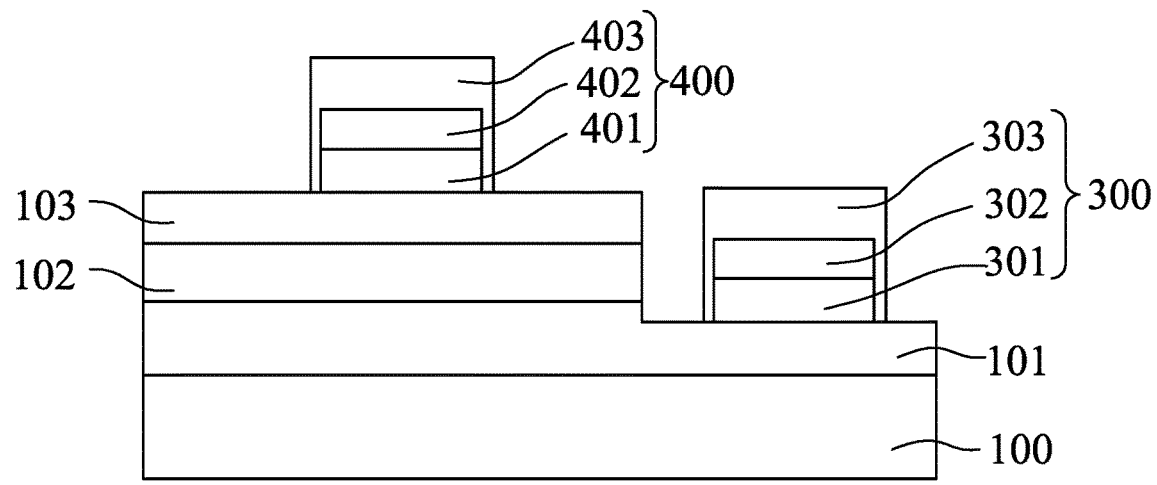

In step 14, through a deposition process (e.g. electron-beam vapor deposition, ion sputtering deposition, etc.), the first metallic multilayer electrode 300 is formed on the first placement portion of the first-type semiconductor layer 101, and the second metallic multilayer electrode 400 is formed on the second-type semiconductor layer 103 (see FIG. 9).

Figure 10:
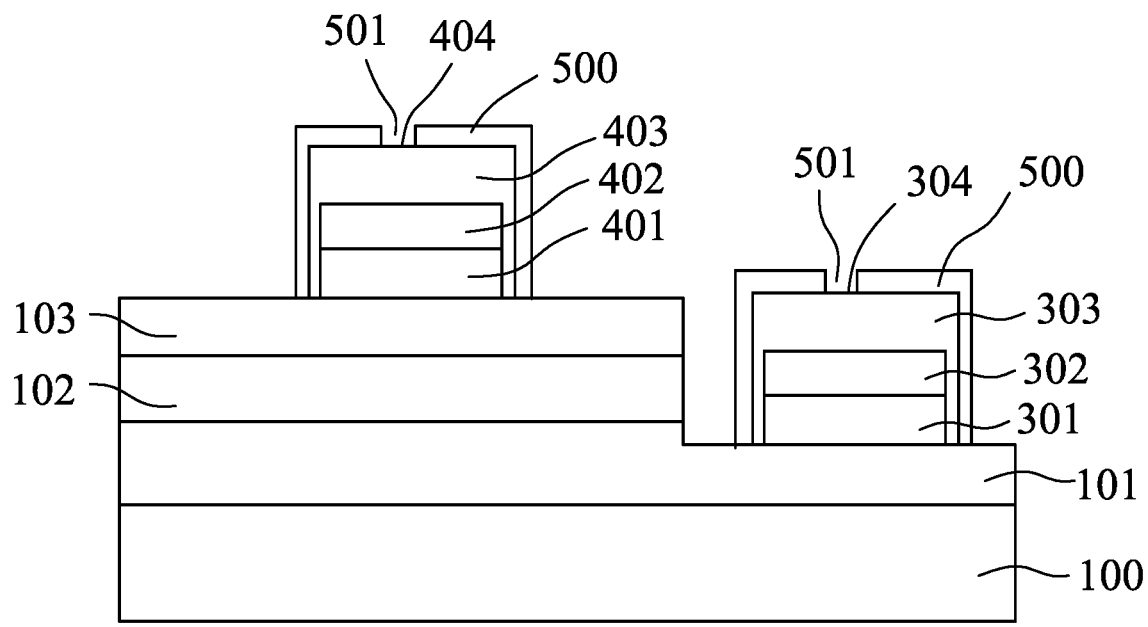

In step 15, through a deposition process (e.g. electron-beam vapor deposition, ion sputtering deposition, etc.), the metallic adhesion layer 500 is formed over the first and second metallic multilayer electrodes 300, 400 (see FIG. 10). The first through-holes 501 of the metallic adhesion layer 500 are formed through lithography and etching.

Figure 11:
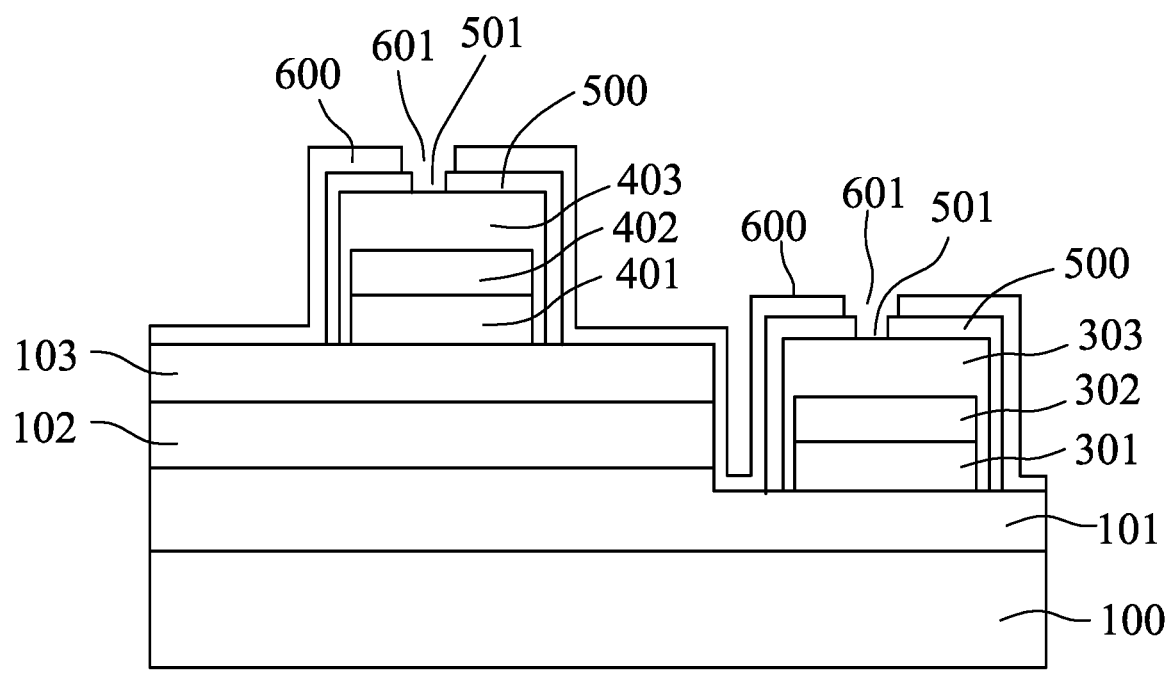

In step 16, the protective layer 600 is deposited on the metallic adhesion layer 500, the parts of the loading surface of the second-type semiconductor layer 103 that the second metallic multilayer electrode 400 is not disposed on, the lateral surface of the second-type semiconductor layer 103, the side surface of the light emitting layer 102, the spacer portion of the first-type semiconductor layer 101, and the parts of the first placement portion of the first-type semiconductor layer 101 that the first metallic multilayer electrode 300 is not disposed on (see FIG. 11). The second through-holes 601 of the protective layer 600 are formed through lithography and etching.

Referring to FIGS. 13 to 18, the stepped portions 502 of the metallic adhesion layer 500 may be formed by the following steps (for the sake of brevity, only some of the components of the corresponding electrode are shown in the drawings).

Figure 13:
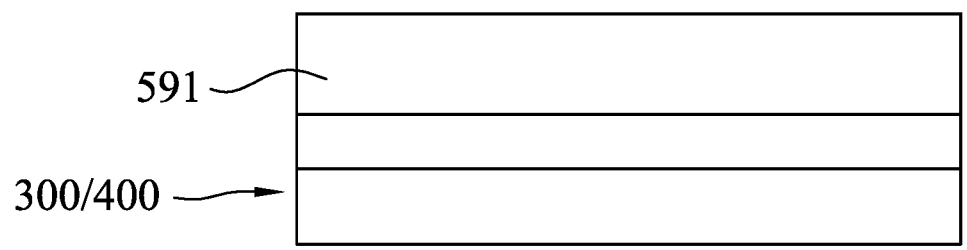
FIGS. 13 to 18 are schematic sectional views respectively illustrating steps of forming a stepped portion of a metallic adhesion layer of the light emitting device according to the second and third embodiments.
Figure 14:
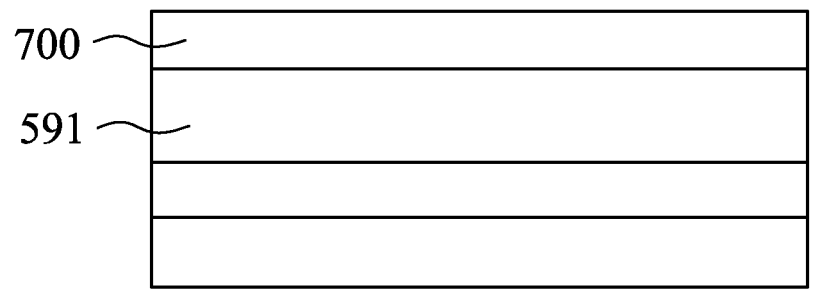
Figure 15:
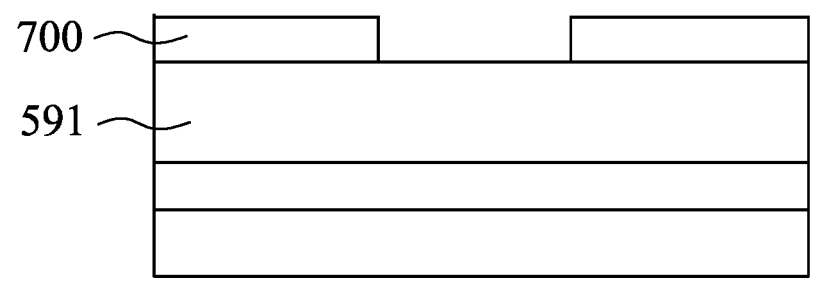
Figure 16:
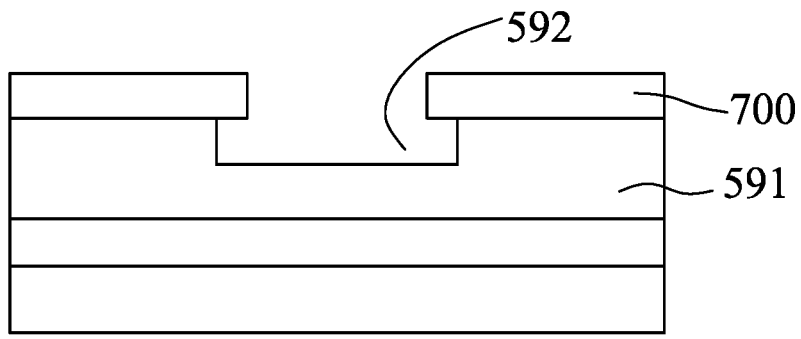

A metallic preformed layer 591 is formed over a corresponding one of the first and second metallic multilayer electrodes 300, 400 (see FIG. 13). A mask layer 700 (e.g. a photoresist) is coated on the metallic preformed layer 591 (see FIG. 14). The mask layer 700 is patterned through lithography so as to form a through-hole 702 that partially exposes the metallic preformed layer 591 (see FIG. 15). A first part of the metallic preformed layer 591 is removed by way of the through-hole 702 of the mask layer 700 through wet etching, so as to form a recess 592 (see FIG. 16). By adjusting the concentration of the wet etching agent applied and the time of wet etching, the recess 592 can be formed to have a desired depth and a desired width.

Figure 17:
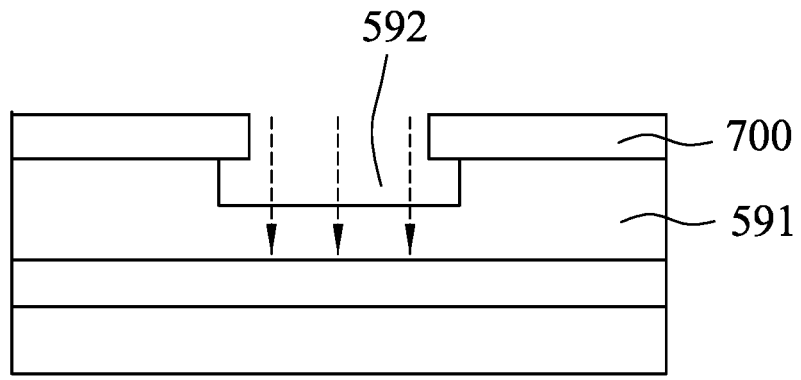
Figure 18:
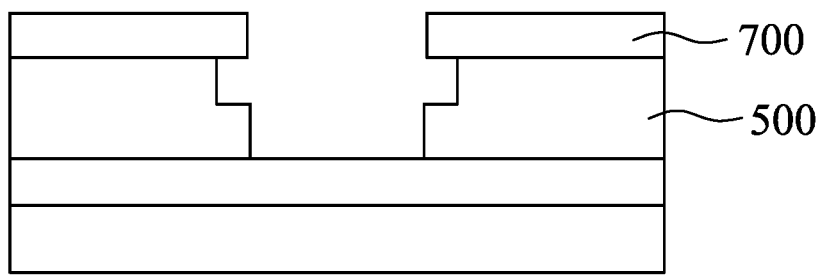

Subsequently, as shown in FIGS. 17 and 18, a second part of the metallic preformed layer 591, which is below the recess 592 of the metallic preformed layer 591, is removed along a vertical direction (indicated by the dotted arrows in FIG. 17) by way of the through-hole 702 of the mask layer 700 and the recess 592 through dry etching (e.g. ICP etching). Accordingly, the metallic adhesion layer 500 is formed to have one of the through-holes 501, which partially exposes the corresponding one of the top electrode surfaces 304, 404 of the first and second metallic multilayer electrodes 300, 400, and which is defined by the corresponding lowered hole defining wall 503. The mask layer 700 is then removed.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light emitting device comprising:
  a substrate;
  a light emitting unit disposed on said substrate, and including a first-type semiconductor layer, a light emitting layer, and a second-type semiconductor layer which are sequentially arranged from bottom to top, said first-type semiconductor layer being partially overlaid by said light emitting layer and said second-type semiconductor layer;
a metallic electrode unit including a first metallic multilayer electrode and a second metallic multilayer electrode, said first metallic multilayer electrode being disposed on a first placement portion of said first-type semiconductor layer which is not overlaid by said light emitting layer and said second-type semiconductor layer, said light emitting layer and said second-type semiconductor layer being disposed on a second placement portion of said first-type semiconductor layer to overlay said first-type semiconductor layer, said first and second placement portions of said first-type semiconductor layer being separated by a spacer portion of said first-type semiconductor layer, said second metallic multilayer electrode being disposed on said second-type semiconductor layer;
a metallic adhesion layer disposed on said first and second metallic multilayer electrodes; and
a protective layer disposed on said metallic adhesion layer,
wherein each of said first and second metallic multilayer electrodes is partially exposed by said metallic adhesion layer and said protective layer, said metallic adhesion layer being partially exposed by said protective layer on each of the first and second metallic multilayer electrodes,
wherein said first-type semiconductor layer extends from a top surface of said substrate to terminate at an upper surface that has said first and second placement portions and said spacer portion, said light emitting layer extending from said second placement portion of said upper surface of said first-type semiconductor layer to terminate at an upward surface, said second-type semiconductor layer extending from said upward surface of said light emitting layer to terminate at an upper surface on which said second metallic multilayer electrode is disposed,
wherein said metallic adhesion layer is disposed over said first and second metallic multilayer electrodes, and has two first through-holes that partially expose a top electrode surface of said first metallic multilayer electrode and a top electrode surface of said second metallic multilayer electrode, respectively, and
wherein said protective layer is disposed over said metallic adhesion layer, and has two second through-holes that are in spatial communication with said first through-holes, respectively, said second through-holes partially exposing said top electrode surface of said first metallic multilayer electrode and said top electrode surface of said second metallic multilayer electrode, respectively, said second through-holes being larger in size than said first through-holes, respectively, so that said second through-holes partially expose said metallic adhesion layer.

2. The light emitting device as claimed in claim 1, wherein an exposed part of said top electrode surface of said first metallic multilayer electrode, which is exposed by a respective one of said first through-holes and a respective one of said second through-holes, and an exposed part of said top electrode surface of said second metallic multilayer electrode, which is exposed by a respective one of said first through-holes and a respective one of said second through-holes, are each adapted to be connected to a bonding wire, adhesion between said metallic adhesion layer and said first metallic multilayer electrode being stronger than that between said metallic adhesion layer and the bonding wire, adhesion between said metallic adhesion layer and said second metallic multilayer electrode being stronger than that between said metallic adhesion layer and the bonding wire.

3. The light emitting device as claimed in claim 1, wherein said metallic adhesion layer is made from a material selected from the group consisting of Ti, TiN, Cr, Ni, and combinations thereof.

4. The light emitting device as claimed in claim 1, wherein said first metallic multilayer electrode includes a first bottom layer that is disposed on said first placement portion of said first-type semiconductor layer, and a first top layer that is disposed over said first bottom layer and has said top electrode surface of said first metallic multilayer electrode, said second metallic multilayer electrode including a second bottom layer that is disposed on said upper surface of said second-type semiconductor layer, and a second top layer that is disposed over said second bottom layer and has said top electrode surface of said second metallic multilayer electrode, said first top layer of said first metallic multilayer electrode and said second top layer of said second metallic multilayer electrode each being made from Pt.

5. The light emitting device as claimed in claim 1, wherein one of said first-type semiconductor layer and said second-type semiconductor layer is an n-type semiconductor layer, and the other one of said first-type semiconductor layer and said second-type semiconductor layer is a p-type semiconductor layer.

6. The light emitting device as claimed in claim 1, wherein each of said first-type semiconductor layer, said light emitting layer, and said second-type semiconductor layer is made from a GaN-based semiconductor material.

7. The light emitting device as claimed in claim 1, wherein said protective layer is made from a material selected from the group consisting of $SiO_2$, $Si_3N_4$, $Al_2O_3$, $TiO_2$, and combinations thereof.

8. A light emitting device comprising:
a substrate;
a light emitting unit disposed on said substrate, and including a first-type semiconductor layer, a light emitting layer, and a second-type semiconductor layer which are sequentially arranged from bottom to top, said first-type semiconductor layer being partially overlaid by said light emitting layer and said second-type semiconductor layer;
a metallic electrode unit including a first metallic multilayer electrode and a second metallic multilayer electrode, said first metallic multilayer electrode being disposed on a first placement portion of said first-type semiconductor layer which is not overlaid by said light emitting layer and said second-type semiconductor layer, said light emitting layer and said second-type semiconductor layer being disposed on a second placement portion of said first-type semiconductor layer to overlay said first-type semiconductor layer, said first and second placement portions of said first-type semiconductor layer being separated by a spacer portion of said first-type semiconductor layer, said second metallic multilayer electrode being disposed on said second-type semiconductor layer;
a metallic adhesion layer disposed on said first and second metallic multilayer electrodes; and
a protective layer disposed on said metallic adhesion layer, wherein each of said first and second metallic multilayer electrodes is partially exposed by said metallic adhesion layer and said protective layer, said metallic adhesion layer being partially exposed by said protective layer on each of the first and second metallic multilayer electrodes, wherein said first-type semiconductor layer extends from a top surface of said substrate to terminate at an upper surface that has said first and second placement portions and said spacer portion, said light emitting layer extending from said second placement portion of said upper surface of said first-type semiconductor layer to terminate at an upward surface, said second-type semiconductor layer extending from said upward surface of said light emitting layer to terminate at an upper surface on which said second metallic multilayer electrode is disposed, wherein said metallic adhesion layer is disposed over said first and second metallic multilayer electrodes, and has two first through-holes that partially expose a top electrode surface of said first metallic multilayer electrode and a top electrode surface of said second metallic multilayer electrode, respectively, and wherein said metallic adhesion layer has a stepped portion that is disposed over one of said top electrode surfaces of said first and second metallic multilayer electrodes, and that has a lowered hole defining wall defining a corresponding one of said first through-holes.

9. The light emitting device as claimed in claim 8, wherein said metallic adhesion layer is made from a material selected from the group consisting of Ti, TiN, Cr, Ni, and combinations thereof.

10. The light emitting device as claimed in claim 8, wherein said first metallic multilayer electrode includes a first bottom layer that is disposed on said first placement portion of said first-type semiconductor layer, and a first top layer that is disposed over said first bottom layer and has said top electrode surface of said first metallic multilayer electrode, said second metallic multilayer electrode including a second bottom layer that is disposed on said upper surface of said second-type semiconductor layer, and a second top layer that is disposed over said second bottom layer and has said top electrode surface of said second metallic multilayer electrode, said first top layer of said first metallic multilayer electrode and said second top layer of said second metallic multilayer electrode each being made from Pt.

11. The light emitting device as claimed in claim 8, wherein one of said first-type semiconductor layer and said second-type semiconductor layer is an n-type semiconductor layer, and the other one of said first-type semiconductor layer and said second-type semiconductor layer is a p-type semiconductor layer.

12. The light emitting device as claimed in claim 8, wherein each of said first-type semiconductor layer, said light emitting layer, and said second-type semiconductor layer is made from a GaN-based semiconductor material.

13. The light emitting device as claimed in claim 8, wherein said protective layer is made from a material selected from the group consisting of $SiO_2$, $Si_3N_4$, $Al_2O_3$, $TiO_2$, and combinations thereof.

* * * * *